US012702000B2

(12) United States Patent
Li et al.

(10) Patent No.: US 12,702,000 B2
(45) Date of Patent: Aug. 4, 2026

(54) SEMICONDUCTOR DEVICE AND MANUFACTURING METHOD THEREOF

(71) Applicant: MEDIATEK Inc., Hsin-Chu (TW)

(72) Inventors: Yu-Jin Li, Hsinchu City (TW); Bo-Jiun Yang, Hsinchu City (TW); Tai-Yu Chen, Hsinchu City (TW); Tsung-Yu Pan, Hsinchu City (TW); Chun-Yin Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 525 days.

(21) Appl. No.: 18/172,409

(22) Filed: Feb. 22, 2023

(65) Prior Publication Data

US 2023/0197667 A1 Jun. 22, 2023

Related U.S. Application Data

(63) Continuation-in-part of application No. 17/700,571, filed on Mar. 22, 2022, now Pat. No. 12,300,573.
(Continued)

(51) Int. Cl.
H10W 40/25 (2026.01)
H10W 70/02 (2026.01)
(Continued)

(52) U.S. Cl.
CPC ........... H10W 40/25 (2026.01); H10W 70/02 (2026.01); H10W 74/01 (2026.01);
(Continued)

(58) Field of Classification Search
CPC ..... H01L 24/32; H01L 21/4871; H01L 21/56; H01L 23/3107; H01L 23/373; H01L 24/16; H01L 23/49816; H01L 2224/16225; H01L 2224/32111; H01L 2224/32225; H01L 2924/182; H01L 24/81; H01L 2924/15311;
(Continued)

(56) References Cited

U.S. PATENT DOCUMENTS

| | | | |
|---|---|---|---|
| 10,643,924 | B1 | 5/2020 | Shen |
| 2001/0026957 | A1 | 10/2001 | Atwood |

(Continued)

FOREIGN PATENT DOCUMENTS

| | | |
|---|---|---|
| CN | 100539052 C | 9/2009 |
| EP | 4071799 A1 | 10/2022 |
| JP | S6084848 A | 5/1985 |

OTHER PUBLICATIONS

EP Search Report dated Aug. 21, 2023 in EP application No. 23163214.2-1211.
(Continued)

*Primary Examiner* — Patricia D Valenzuela
(74) *Attorney, Agent, or Firm* — McClure, Qualey & Rodack, LLP

(57) ABSTRACT

A semiconductor device includes a substrate, an electronic component, a cover, a heat conduction component and a dam. The electronic component is disposed on the substrate. The cover is disposed on the substrate and covers the electronic component. The heat conduction component is disposed between the electronic component and the cover. The dam is disposed between the electronic component and the cover and surrounds the heat conduction component.

8 Claims, 12 Drawing Sheets

Related U.S. Application Data

(60) Provisional application No. 63/381,573, filed on Oct. 31, 2022, provisional application No. 63/172,124, filed on Apr. 8, 2021.

(51) Int. Cl.

| | |
|---|---|
| *H10W 74/01* | (2026.01) |
| *H10W 74/10* | (2026.01) |
| *H10W 72/00* | (2026.01) |
| *H10W 72/30* | (2026.01) |
| *H10W 74/00* | (2026.01) |
| *H10W 90/00* | (2026.01) |

(52) U.S. Cl.
CPC .... *H10W 74/111* (2026.01); *H10W 72/07354* (2026.01); *H10W 72/342* (2026.01); *H10W 74/00* (2026.01); *H10W 90/701* (2026.01); *H10W 90/724* (2026.01); *H10W 90/734* (2026.01)

(58) Field of Classification Search
CPC .... H01L 23/3675; H01L 23/42; H10W 40/25; H10W 70/02; H10W 74/01; H10W 74/111; H10W 72/07354; H10W 72/342; H10W 74/00; H10W 90/701; H10W 90/724; H10W 90/734; H10W 72/072; H10W 72/30; H10W 40/70; H10W 40/22
See application file for complete search history.

(56) References Cited

U.S. PATENT DOCUMENTS

| | | | | |
|---|---|---|---|---|
| 2004/0036183 | A1* | 2/2004 | Im | ........................... H01L 23/42 |
| | | | | 257/796 |
| 2004/0262766 | A1 | 12/2004 | Houle | |
| 2006/0113105 | A1 | 6/2006 | Kubo | |
| 2006/0118925 | A1* | 6/2006 | Macris | ................... H01L 23/26 |
| | | | | 257/667 |
| 2006/0220225 | A1 | 10/2006 | Ni | |
| 2007/0205473 | A1 | 9/2007 | Youngner | |
| 2018/0151472 | A1 | 5/2018 | Chen | |
| 2019/0393118 | A1 | 12/2019 | Rawlings | |
| 2020/0168523 | A1 | 5/2020 | Huang | |
| 2020/0227336 | A1 | 7/2020 | Eid | |
| 2020/0388554 | A1 | 12/2020 | Falola | |
| 2020/0402885 | A1 | 12/2020 | Kim | |
| 2021/0249333 | A1 | 8/2021 | Lewison | |
| 2022/0375813 | A1 | 11/2022 | Huang | |

OTHER PUBLICATIONS

TW Office Action dated Jul. 15, 2024 in Taiwan application No. 112108693.

EP Search Report dated Jul. 29, 2024 in European application No. 24157974.7-1211.

EP Search Report dated Sep. 5, 2022 in European application No. 2216924.6-1211.

TW Office Action dated Dec. 5, 2022 in Taiwan application No. 111111092.

TW Office Action dated Mar. 5, 2024 in Taiwan application No. 112108693.

TW Office Action dated May 15, 2024 in Taiwan application No. 112108693.

Non-Final Office Action issued in U.S. Appl. No. 18/422,166, filed Jan. 25, 2024, mailed Mar. 25, 2026.

\* cited by examiner

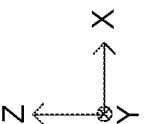
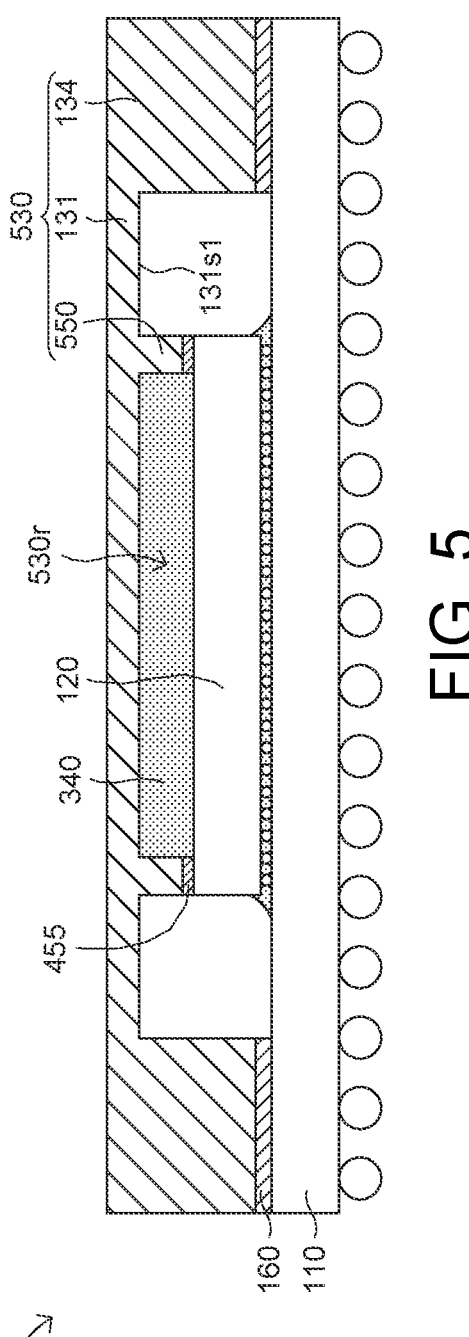
FIG. 5

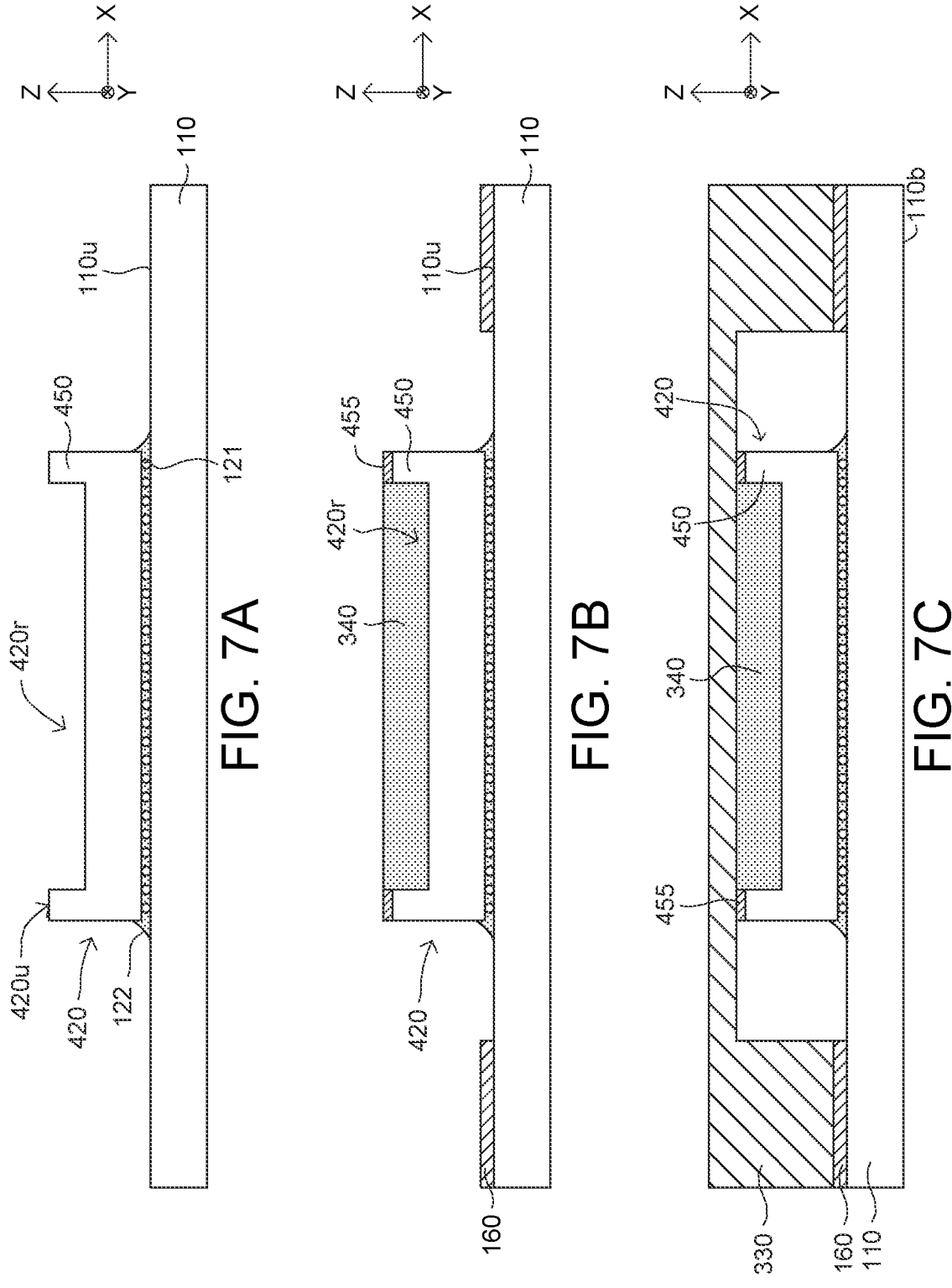

SEMICONDUCTOR DEVICE AND MANUFACTURING METHOD THEREOF

This is a continuation-in-part of U.S. application Ser. No. 17/700,571, filed Mar. 22, 2022, now U.S. Pat. No. 12,300, 573, which claims the benefit of U.S. provisional application Ser. No. 63/172,124, filed Apr. 8, 2021. This continuation-in-part application claims the benefit of U.S. provisional application Ser. No. 63/381,573, filed Oct. 31, 2022, the subject matter of which is incorporated herein by reference.

FIELD OF THE INVENTION

The invention relates to a semiconductor device and a manufacturing method thereof, and more particularly to a semiconductor device including a liquid metal and a manufacturing method thereof.

BACKGROUND OF THE INVENTION

Conventional semiconductor device includes a substrate and an electronic component disposed on the substrate. However, the electronic component inevitably generates heat during operation. Thus, how to dissipate the heat from the electronic component has become a prominent task for the industries.

SUMMARY OF THE INVENTION

In an embodiment of the invention, a semiconductor device is provided. The semiconductor device includes a substrate, an electronic component, a cover, a heat conduction component and a dam. The electronic component is disposed on the substrate. The cover is disposed on the substrate and covers the electronic component. The heat conduction component is disposed between the electronic component and the cover. The dam is disposed between the electronic component and the cover and surrounds the heat conduction component.

In another embodiment of the invention, a semiconductor method is provided. The manufacturing method includes the following steps: disposing an electronic component on a substrate; disposing a cover on the substrate to cover the electronic component; and disposing a heat conduction component which is surrounded by a dam.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which:

FIG. 5 illustrates a cross-sectional view of a semiconductor device according to another embodiment of the invention;

FIGS. 7A to 7C illustrate manufacturing processes of the semiconductor device of FIG. 4.

DETAILED DESCRIPTION OF PREFERRED EMBODIMENTS

Figure 1A:
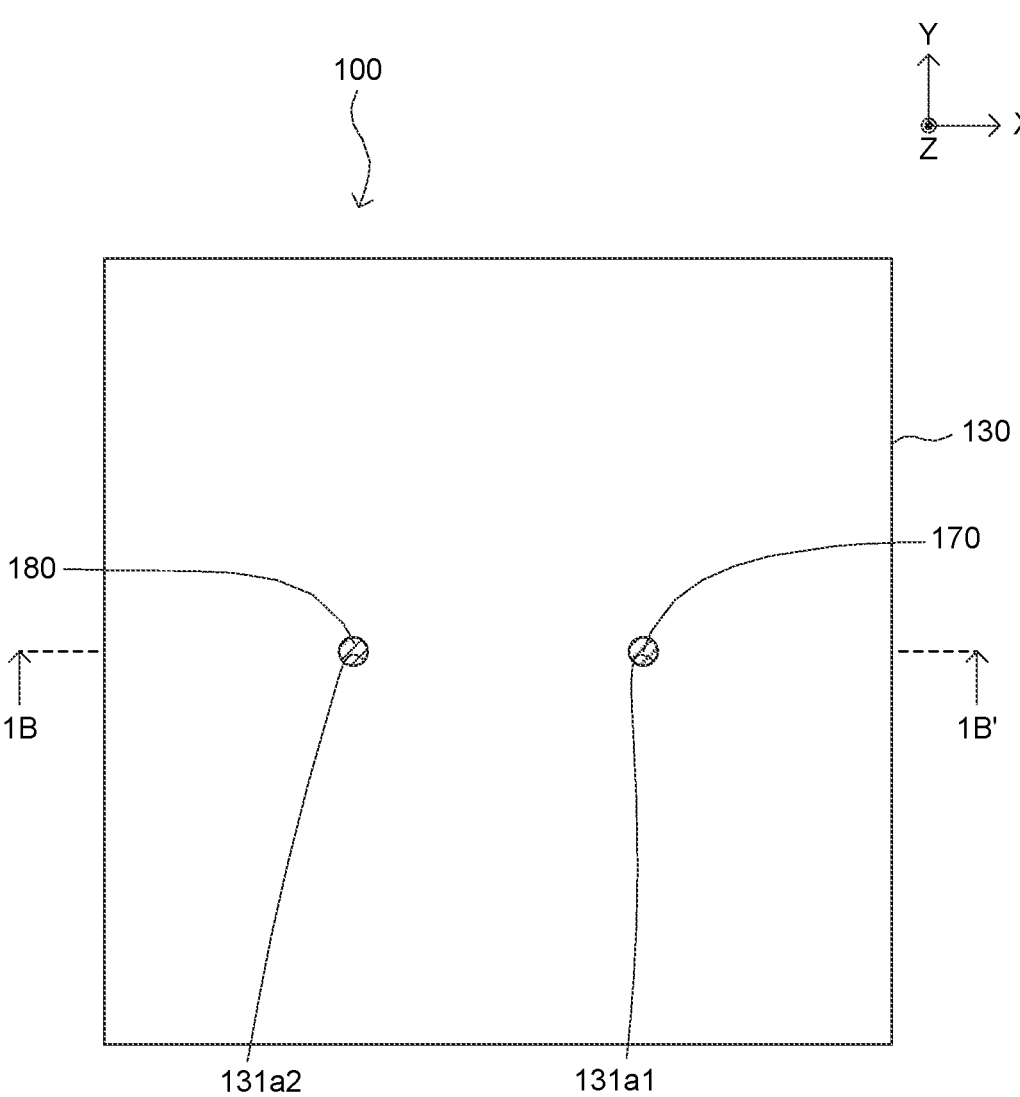
FIG. 1A illustrates a diagram view of a top view of a semiconductor device according to an embodiment of the invention.
Figure 1B:
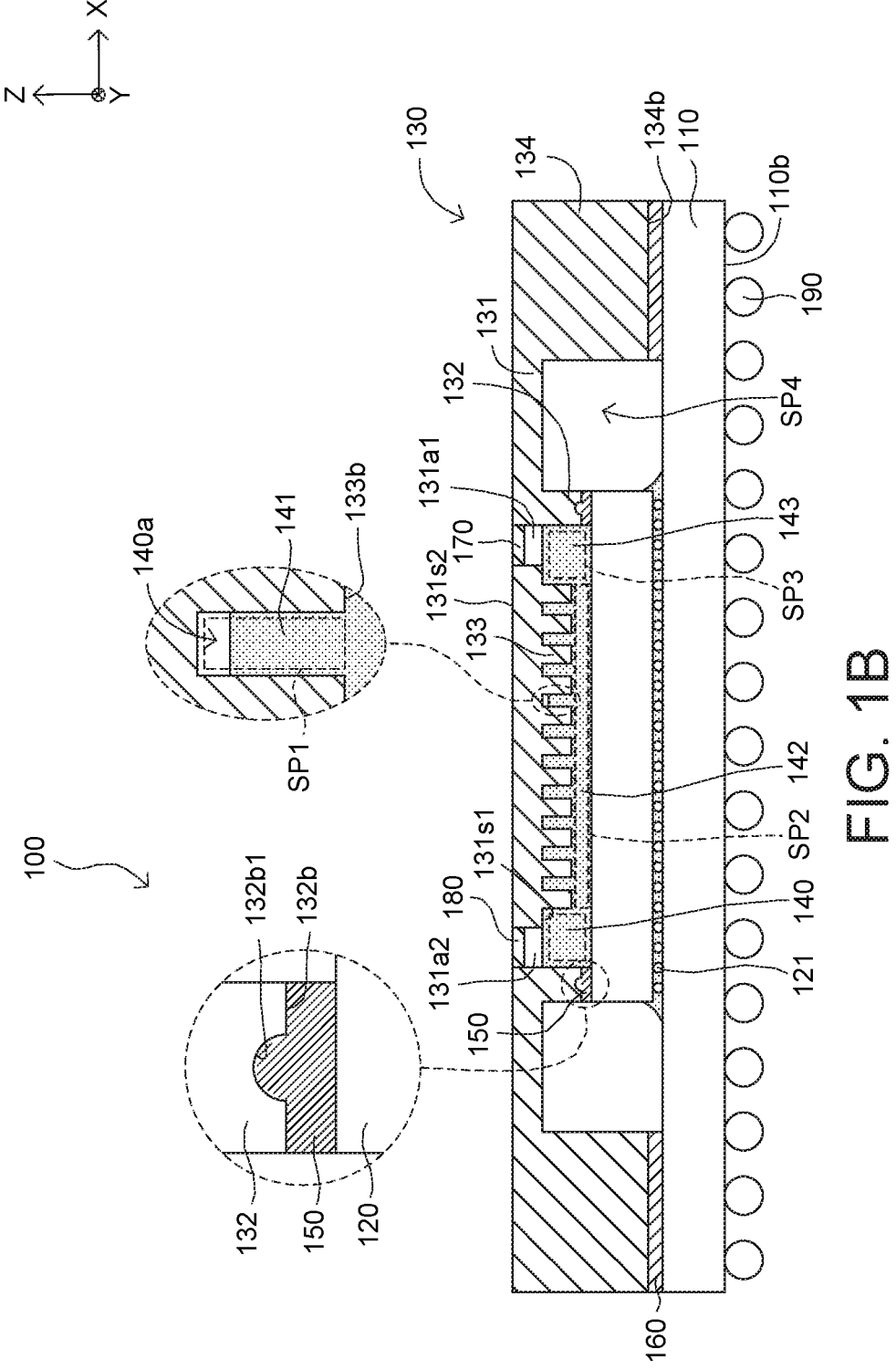
FIG. 1B illustrates a cross-sectional view of the semiconductor device of FIG. 1A along a direction 1B-1B'.
Figure 1C:
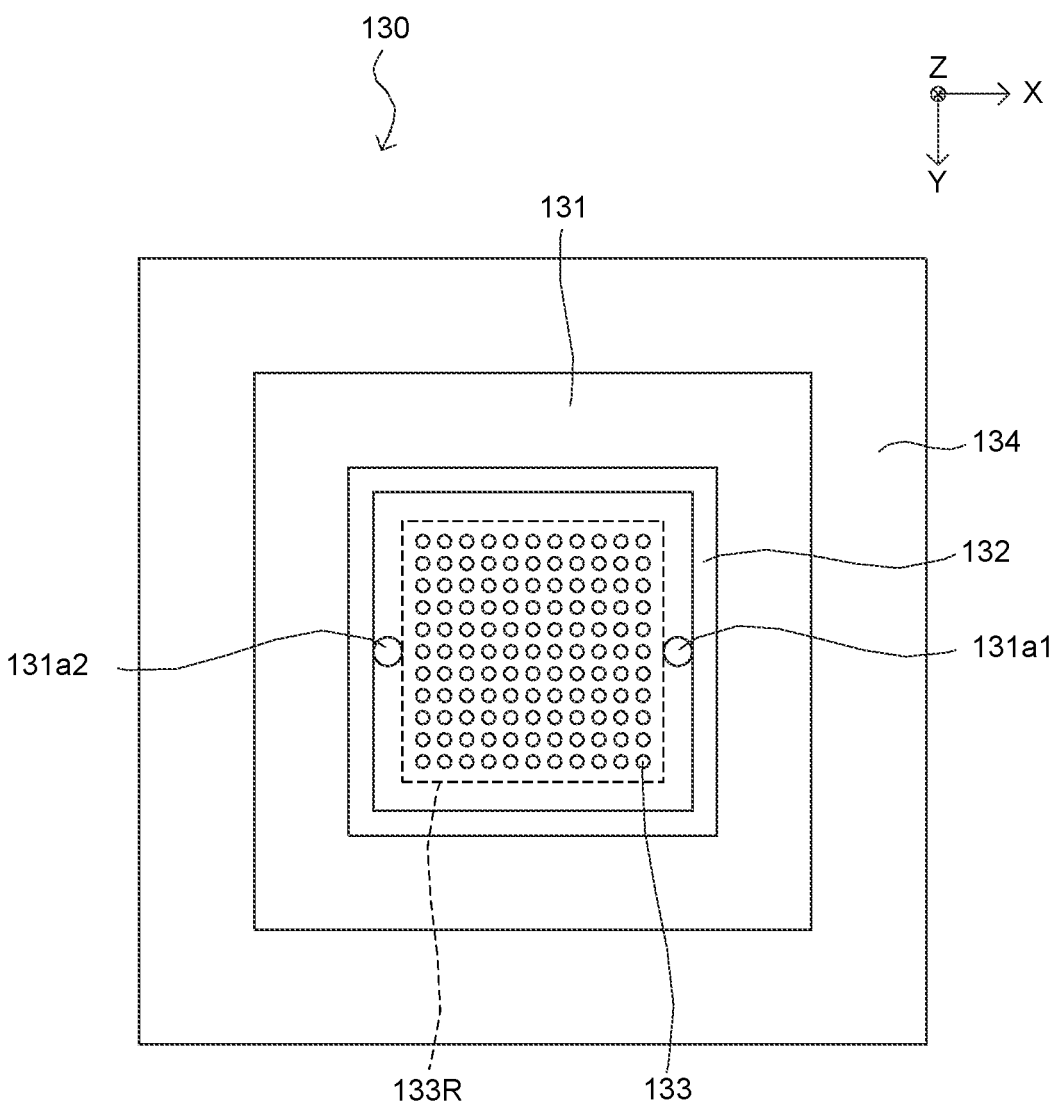
FIG. 1C illustrates a diagram view of a bottom view of a cover of FIG. 1B.

Referring to FIGS. 1A to 1C, FIG. 1A illustrates a diagram view of a top view of a semiconductor device 100 according to an embodiment of the invention, FIG. 1B illustrates a cross-sectional view of the semiconductor device 100 of FIG. 1A along a direction 1B-1B', and FIG. 1C illustrates a diagram view of a bottom view of a cover 130 of FIG. 1B.

The semiconductor device 100 is, for example, a Flip Chip Ball Grid Array (FCBGA), such as a High Performance FCBGA; however, such exemplification is not meant to be for limiting.

As illustrated in FIGS. 1A and 1B, the semiconductor device 100 includes a substrate 110, an electronic component 120, a cover 130, a liquid metal 140, a first adhesive layer 150, a second adhesive layer 160, a first seal 170, a second seal 180 and at least one conductive portion 190.

As illustrated in FIG. 1B, the electronic component 120 is disposed on the substrate 110. The cover 130 is disposed on the substrate 110 and covers the electronic component 120. The liquid metal 140 is formed between the cover 130 and the electronic component 120. As a result, the heat generated by the electronic component 120 could be dissipated through the liquid metal 140 and the cover 130.

The substrate 110 has, for example, single-layered structure or multi-layered structure. Although not illustrated, the substrate 110 includes at least one conductive trace, at least one conductive via and/or at least one conductive pad, wherein the conductive traces are electrically connected with at least one conductive via. In an embodiment, the substrate 110 is, for example, a printed circuit board (PCB), an interposer, another semiconductor device or a semiconductor package.

The electronic component 120 is electrically connected with the conductive portion 190 through the substrate 110. The electronic component 120 is, for example, the component capable of applying to (or disposed on) a package requiring high-power operation, such as Flip Chip BGA (FCBGA), Fan-out package, 3D (three-dimension) IC (Integrated Circuit) package, etc. The electronic component 120 includes at least one conductive portion 121, wherein the conductive portion 121 is, for example, bump or solder ball. The electronic component 120 is bonded to the at least one conductive pad (not illustrated) of the substrate 110 through at least one conductive portion 121.

The cover 130 is made by a material, for example, metal, such as copper, aluminum, iron or a combination thereof.

The cover 130 could conduct heat and increased strength of the semiconductor device 100 for reducing warpage.

As illustrated in FIGS. 1B and 1C, the cover 130 includes a plate 131, a first surrounding portion 132, at least one pillar 133 and a second surrounding portion 134. The plate 131 has a first surface 131s1 and a second surface 131s2 opposite to the first surface 131s1. The first surface 131s1 faces the electronic component 120. The first surrounding portion 132, the pillars 133 and the second surrounding portion 134 are disposed on the plate 131 and protrude with respect to (or relative to) the first surface 131s1. The first surrounding portion 132 is, for example, a closed-ring for surrounding the whole of the liquid metal 140. Since the pillars 133 protrude with respect to the first surface 131s1, and accordingly it could increase heat conduction area of the cover 130. The second surrounding portion 134 surrounds the first surrounding portion 132, the pillars 133, the electronic component 120 and the liquid metal 140. The second surrounding portion 134 is a closed-ring for surrounding the whole of the first surrounding portion 132, the pillars 133, the electronic component 120 and the liquid metal 140.

As illustrated in FIGS. 1A to 1C, the cover 130 has a first through hole 131a1 and a second through hole 131a2. In the present embodiment, the first through hole 131a1 and second through hole 131a2 are located at the plate 131. For example, the first through hole 131a1 and the second through hole 131a2 both extend to the second surface 131s2 from the first surface 131s1. As a result, during injection of the liquid metal 140, the liquid metal 140 flows into through the first through hole 131a1, and air (if any) could be discharged through the second through hole 131a2.

As illustrated in FIGS. 1A to 1C, the first through hole 131a1 and the second through hole 131a2 are located adjacent to first surrounding portion 132. The first through hole 131a1 and the second through hole 131a2 are located between the whole region 133R of the pillars 133 and the first surrounding portion 132. In the present embodiment, the first through hole 131a1 and the second through hole 131a2 are disposed at two opposite sides of the whole region 133R or the first surrounding portion 132, and thus distance between the first through hole 131a1 and the second through hole 131a2 is long. As a result, during injection of the liquid metal 140, the liquid metal 140 flows into through the first through hole 131a1, and most air could be discharged through the second through hole 131a2. In another embodiment, the first through hole 131a1 and the second through hole 131a2 could be disposed at two opposite corners of the whole region 133R or the first surrounding portion 132 (that is, at two end of the diagonal line of the whole region 133R or the first surrounding portion 132). As a result, the distance between the first through hole 131a1 and the second through hole 131a2 is longest, and accordingly it is more conducive to exhausting the air. In another embodiment, the second through hole 131a2 could be omitted, and the first through hole 131a1 could be disposed at middle position of the second surface 131s2 of the plate 131 or other position of the plate 130.

In terms of the property, the liquid metal 140 has melting point ranging between 60° C. to 70° C., less or higher. During injection of the liquid metal 140, the liquid metal 140 is pre-heated to be at flowable state, injected into space between the cover 130 and the electronic component 120 through the first through hole 131a1, and then solidified, without curing, by cooling or temperature drop. In addition, the liquid metal 140 has thermal conductivity ranging between the 70 W/m–K to 80 W/m–K, or higher. The thermal conductivity of the liquid metal 140 is higher than that of the thermal Interface Material (TIM). Generally, the TIM has thermal conductivity ranging between 2 W/m–K to 5 W/m–K.

As illustrated in FIG. 1B, the liquid metal 140 is formed among the cover 130 and the electronic component 120 as a heat transfer medium. Furthermore, there are a first receiving portion SP1 formed between adjacent two pillars 133, a second receiving portion SP2 formed between a terminal 133b of each pillar 133 and the electronic component 120, and a third receiving portion SP3 formed between the first surrounding portion 132, the first surface 131s1, the outermost pillar 133 and the electronic component 120. Viewed from top of the third receiving portion SP3, the third receiving portion SP3 has a ringed-shape, for example, a closed ringed-shape. The liquid metal 140 includes at least one first metal portion 141, a second metal portion 142 and a third metal portion 143. The first metal portion 141 fills up at least portion of each first receiving portion SP1, the second metal portion 142 fills up at least portion of the second receiving portion SP2, and the third metal portion 143 fills up at least portion of the third receiving portion SP3. As a result, even if the liquid metal 140 has at least one void (or air layer) 140a, the heat generated by the electronic component 120 still could be dissipated through other heat conduction part, such as the first metal portion 141, the second metal portion 142 and the third metal portion 143 which connect the cover 130 and electronic component 120.

In addition, as illustrated in FIG. 1B, there is space SP4 formed among the plate 131, the first surrounding portion 132 and the second surrounding portion 134. There is no physical material formed within the space SP4, for example.

As illustrated in FIG. 1B, the first adhesive layer 150 is disposed between a terminal 132b of the first surrounding portion 132 and the electronic component 120 for fixing relative position between the first surrounding portion 132 and the electronic component 120. In an embodiment, viewed from top of the first adhesive layer 150, the first adhesive layer 150 has a ringed-shape, for example, a closed ringed-shape for closing the gap (if any) between the first surrounding portion 132 and the electronic component 120. As a result, the liquid metal 140 could be prevented from leaking through the first surrounding portion 132 and the electronic component 120. In addition, the terminal 132b has a concave 132b1 for receiving a portion of the first adhesive layer 150, and accordingly it could increase adhesion between the first surrounding portion 132 and the electronic component 120.

As illustrated in FIG. 1B, the second adhesive layer 160 is disposed between a terminal 134b of the second surrounding portion 134 and the substrate 110 for fixing relative position between the cover 130 and the substrate 110. In an embodiment, viewed from top of the second adhesive layer 160, the second adhesive layer 160 has a ringed-shape, for example, a closed ringed-shape for closing the gap (if any) between the second surrounding portion 134 and the substrate 110. As a result, an external impurity is prevented from invading interior of the semiconductor device 100 through the second surrounding portion 134 and the substrate 110.

As illustrated in FIG. 1B, the first seal 170 closes or seals the first through hole 131a1. As a result, the liquid metal 140 is prevented from leaking through the first through hole 131a1, and an external impurity is prevented from invading an interior of the semiconductor device 100 through the first through hole 131a1. In addition, there is space between the first seal 170 and the third metal portion 143 of the liquid metal 140, and there is no physical material formed within the space, and thus the space could receive the thermal expansion of the third metal portion 143.

As illustrated in FIG. 1B, the second seal 180 closes the second through hole 131*a*2. As a result, the liquid metal 140 is prevented from leaking through the second through hole 131*a*2, and an external impurity is prevented from invading an interior of the semiconductor device 100 through the second through hole 131*a*2. In addition, there is space between the second seal 180 and the third metal portion 143 of the liquid metal 140, and there is no physical material formed within the space, and thus the space could receive the thermal expansion of the third metal portion 143.

As illustrated in FIG. 1B, the first adhesive layer 150, the second adhesive layer 160, the first seal 170 and the second seal 180 seal the receiving portions among the cover 130 and the electronic component 120 within.

As illustrated in FIG. 1B, the conductive portions 190 are formed on a lower surface 110*b* of the substrate 110. Any one of the conductive portions 190 is, for example, bump, solder ball, etc. The semiconductor device 100 is bonded to and electrically connected with an external electronic device (for example, PCB, etc.) through the conductive portions 190 of the semiconductor device 100.

Referring to FIGS. 2A to 2E, FIGS. 2A to 2E illustrate manufacturing processes of the semiconductor device 100 of FIG. 1B.

Figures 2A, 2B:
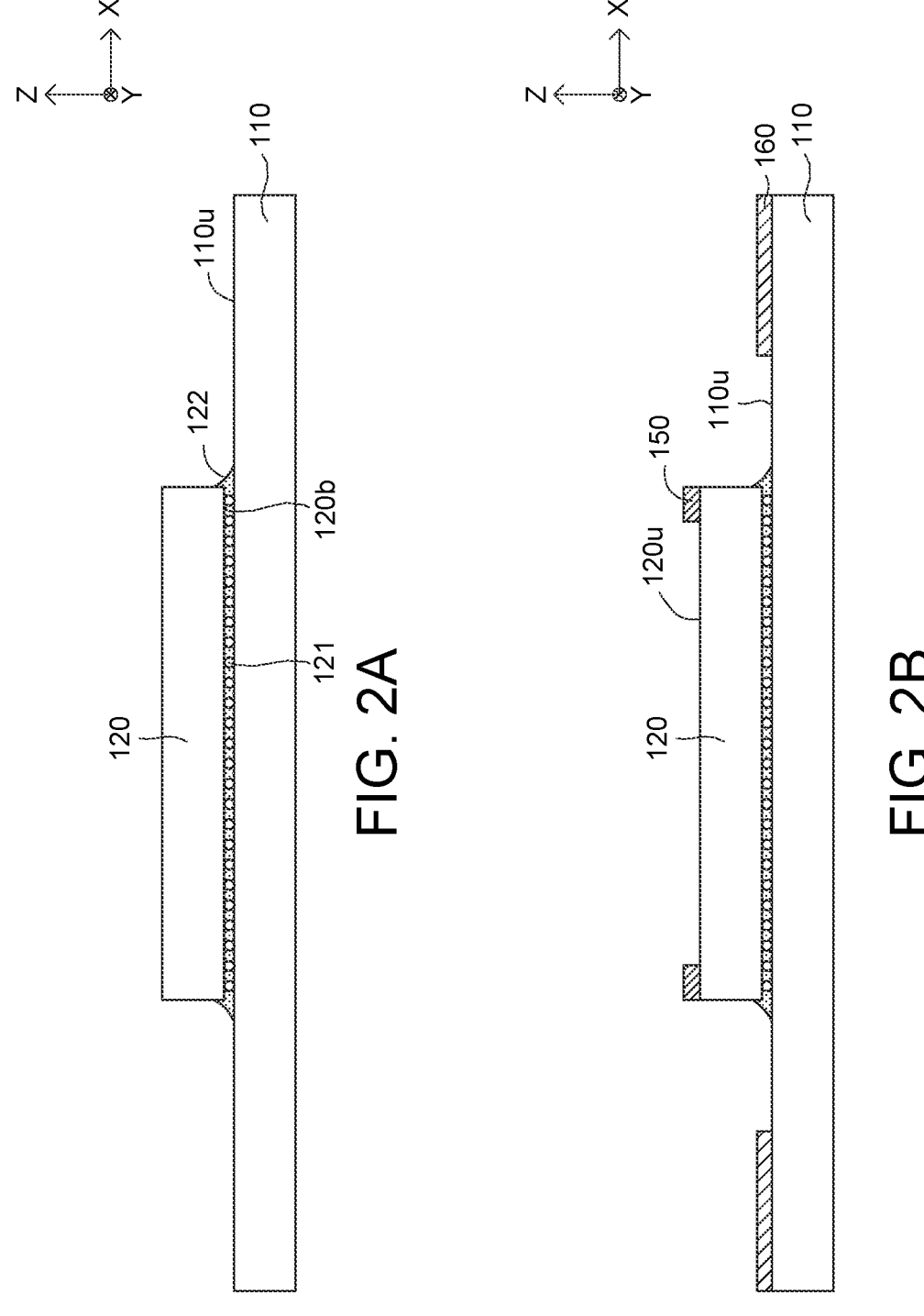
FIGS. 2A to 2E illustrate manufacturing processes of the semiconductor device of FIG. 1B.

As illustrated in FIG. 2A, the electronic component 120 is disposed on the substrate 110, wherein the electronic component 120 includes at least one conductive portion 121, wherein the electronic component 120 is bonded to the substrate 110 through at least one conductive portion 121. In addition, an underfill 122 is formed between a lower surface 120*b* of the electronic component 120 and an upper surface 110*u* of the substrate 110 to encapsulate the conductive portions 121.

As illustrated in FIG. 2B, the first adhesive layer 150 is formed on an upper surface 120*u* of the electronic component 120, wherein the first adhesive layer 150 is formed on a peripheral zone of the upper surface 120*u*. Viewed from top of the first adhesive layer 150, the first adhesive layer 150 has a ringed-shape, for example, a closed ringed-shape.

As illustrated in FIG. 2B, the second adhesive layer 160 is formed on the upper surface 110*u* of the substrate 110, wherein the second adhesive layer 160 is formed on a peripheral zone of the upper surface 110*u*. Viewed from top of the second adhesive layer 160, the second adhesive layer 160 has a ringed-shape, for example, a closed ringed-shape.

In addition, the embodiment of the present invention does not limit the order of forming the first adhesive layer 150 and the second adhesive layer 160.

Figures 2C, 2D:
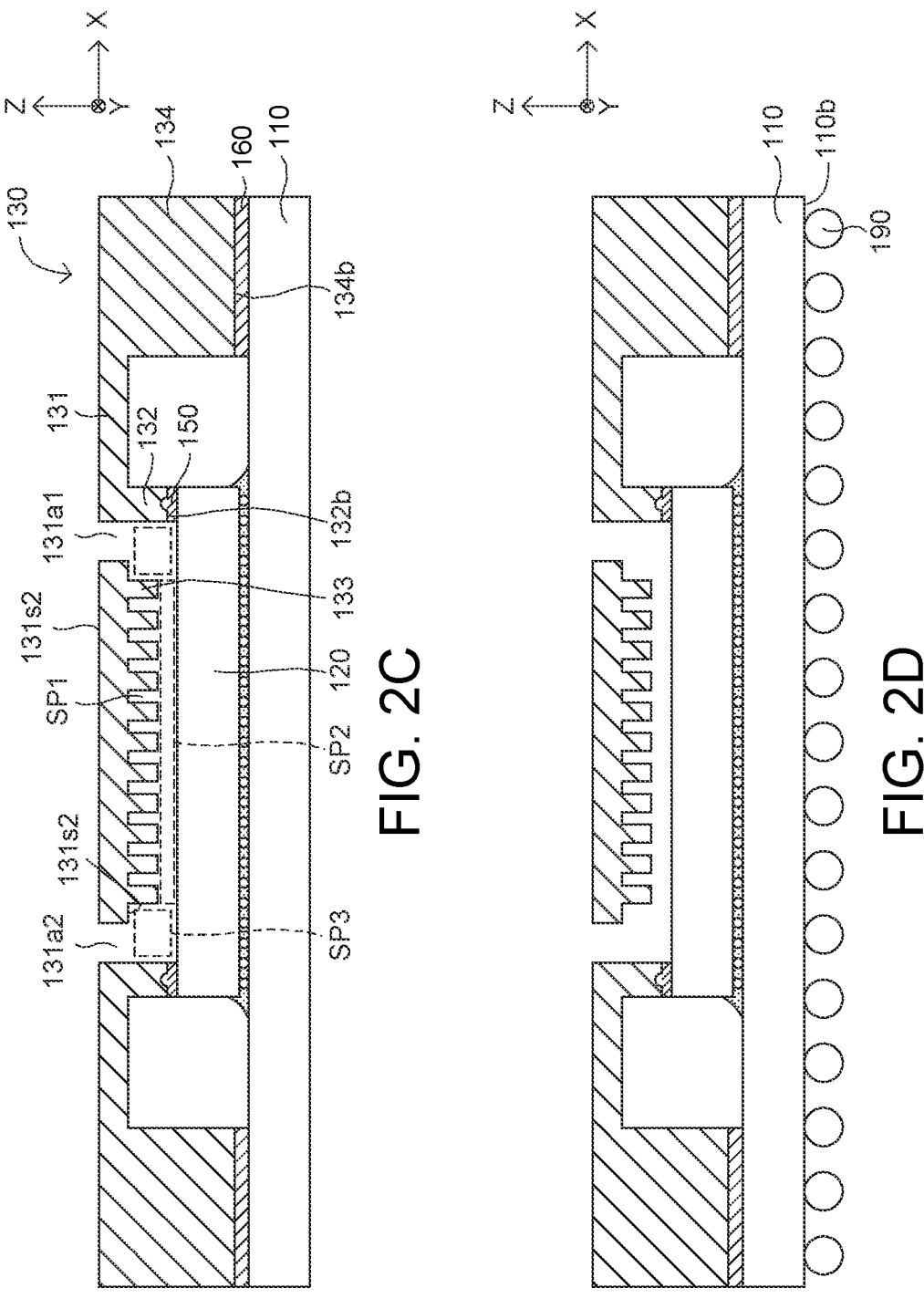

As illustrated in FIG. 2C, the cover 130 is disposed on the substrate 110 to cover the electronic component 120. The cover 130 includes the plate 131, the first surrounding portion 132, at least one pillar 133 and the second surrounding portion 134. The cover 130 has the first through hole 131*a*1 and the second through hole 131*a*2, wherein the first through hole 131*a*1 and the second through hole 131*a*2 both extend to the second surface 131*s*2 of the plate 131 from the first surface 131*s*1 of the plate 131.

In FIG. 2C, the first surrounding portion 132 of the cover 130 adheres to the electronic component 120 through the first adhesive layer 150, and the second surrounding portion 134 of the cover 130 adheres to the substrate 110 through the second adhesive layer 160 for fixing the relative position between the substrate 110 and the cover 130. The first adhesive layer 150 could close the gap (if any) between the first surrounding portion 132 and the electronic component

120, and the second adhesive layer 160 could close the gap (if any) between the second surrounding portion 134 and the substrate 110.

In FIG. 2C, there are the first receiving portion SP1 formed between adjacent two pillars 133, the second receiving portion SP2 formed between the terminal 133*b* of each pillar 133 and the electronic component 120, and the third receiving portion SP3 formed between the first surrounding portion 132, the first surface 131*s*1, the outermost pillar 133 and the electronic component 120. Viewed from top of the third receiving portion SP3, the third receiving portion SP3 has a ringed-shape, for example, a closed ringed-shape.

As illustrated in FIG. 2D, at least one conductive portion 190 is formed on the lower 110*b* of the substrate 110.

Figure 2E:
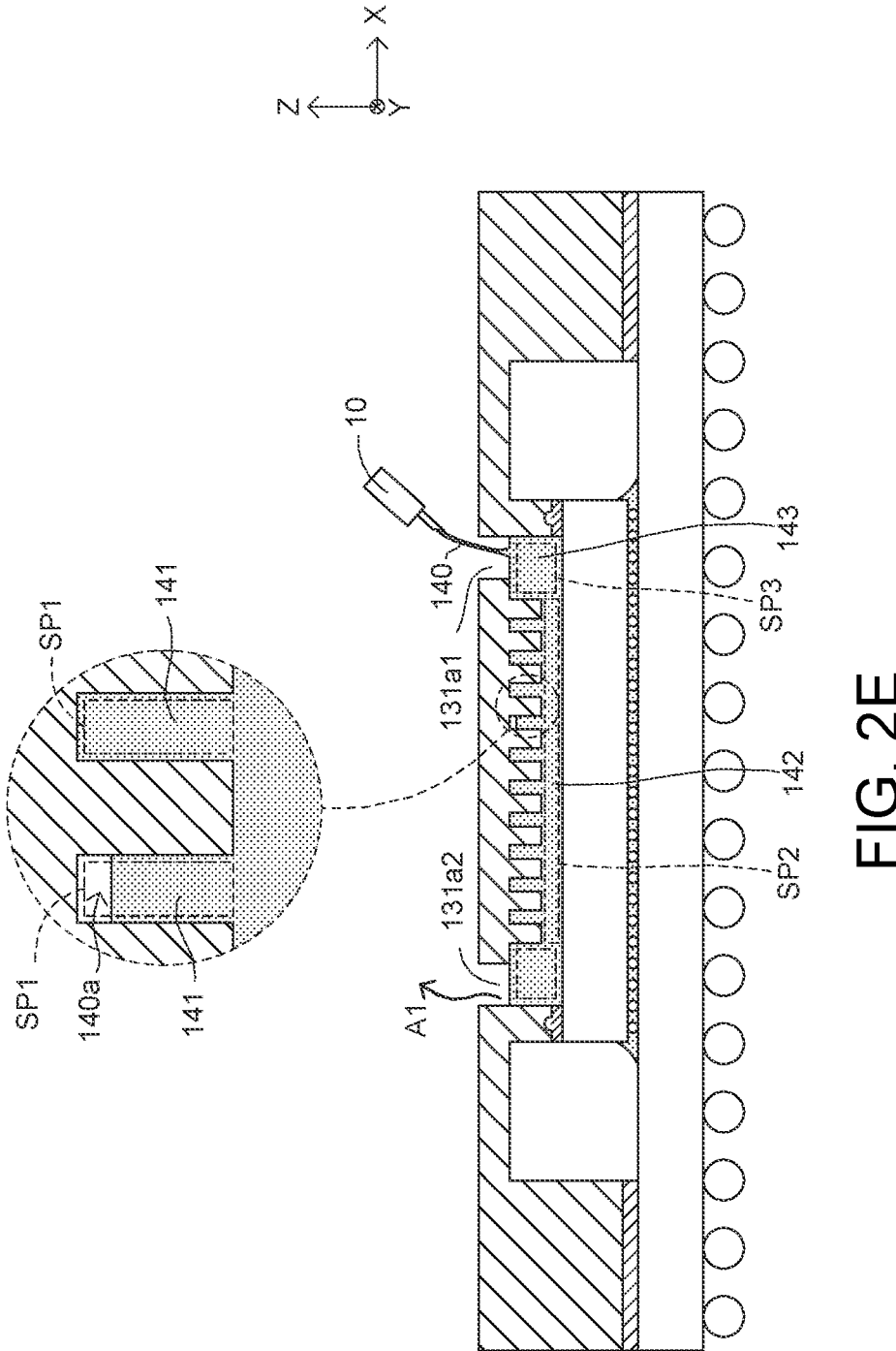

As illustrated in FIG. 2E, the liquid metal 140 is formed between the cover 130 and the electronic component 120 by using injector 10. For example, the liquid metal 140 is injected into the first receiving portion SP1, the second receiving portion SP2 and the third receiving portion SP3 through the first through hole 131*a*1, and gas (for example, air) A1 is discharged through the second through hole 131*a*2.

In FIG. 2E, the liquid metal 140 includes at least one first metal portion 141, the second metal portion 142 and the third metal portion 143. The first metal portion 141 fills up at least portion of each first receiving portion SP1, the second metal portion 142 fills up at least portion of the second receiving portion SP2, and the third metal portion 143 fills up at least portion of the third receiving portion SP3. Due to many portions (for example, the first metal portions 141, the second metal portion 142 and the third metal portion 143) connecting the cover 130 and electronic component 120, even if the liquid metal 140 has at least one void (or air layer) 140*a*, the heat generated by the electronic component 120 still could be dissipated through other heat conduction part, such as the first metal portion 141, the second metal portion 142 and the third metal portion 143 which connect the cover 130 and electronic component 120.

Then, the first seal 170 is formed within the first through hole 131*a*1 to seal the first through hole 131*a*1, as illustrated in FIG. 1B. As a result, the liquid metal 140 is prevented from leaking through the first through hole 131*a*1, and an external impurity is prevented from invading an interior of the semiconductor device 100 through the first through hole 131*a*1. In addition, there is space between the first seal 170 and the third metal portion 143 of the liquid metal 140, and there is no physical material formed within the space, and thus the space could receive the thermal expansion of the third metal portion 143.

Then, the second seal 180 is formed within the second through hole 131*a*2 to seal the second through hole 131*a*2, as illustrated in FIG. 1B. As a result, the liquid metal 140 is prevented from leaking through the second through hole 131*a*2, and an external impurity is prevented from invading an interior of the semiconductor device 100 through the second through hole 131*a*2. In addition, there is space between the second seal 180 and the third metal portion 143 of the liquid metal 140, and there is no physical material formed within the space, and thus the space could receive the thermal expansion of the third metal portion 143.

In addition, the embodiment of the present invention does not limit the order of forming the first seal 170 and the second seal 180.

Figure 3A:
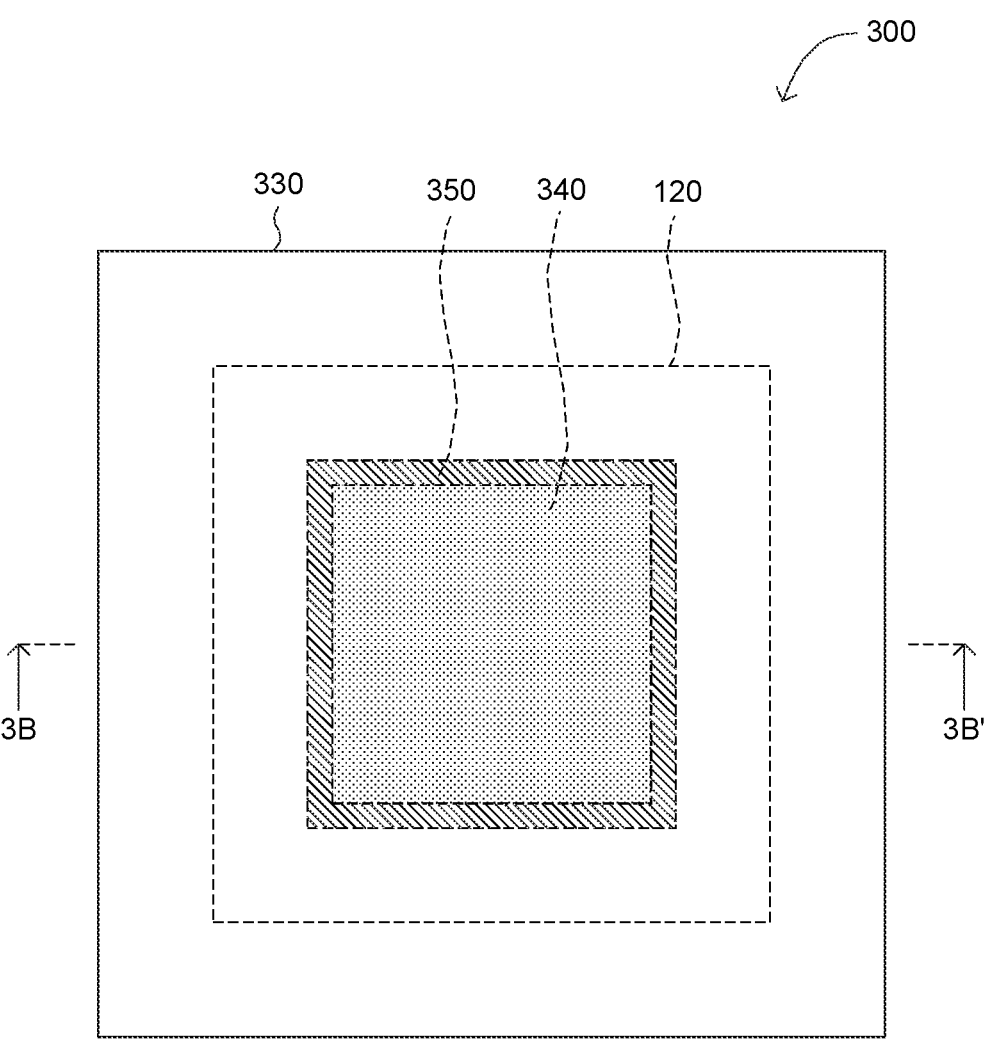
FIG. 3A illustrates a diagram view of a top view of a semiconductor device according to an embodiment of the invention.
Figures 3B, 4:
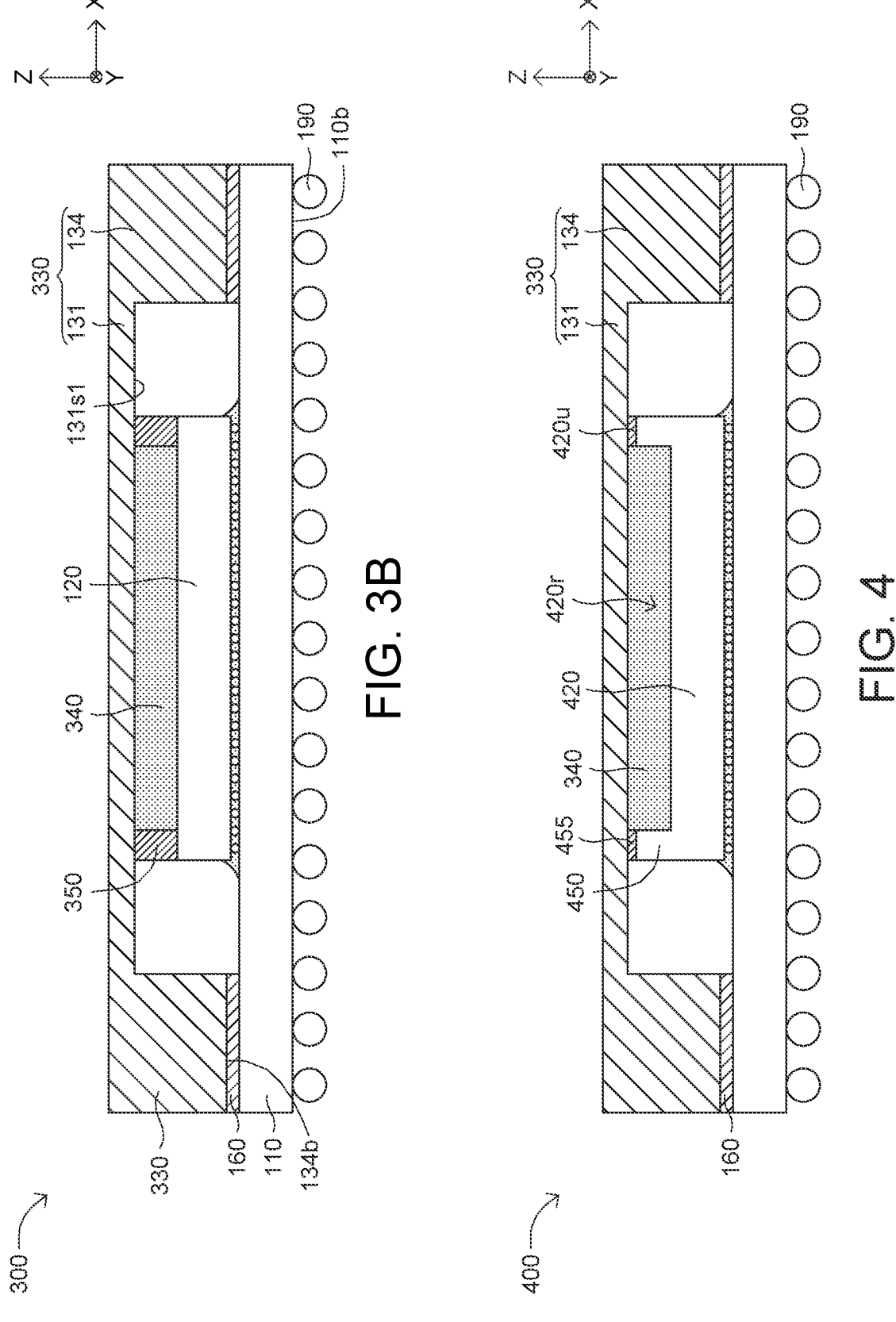
FIG. 3B illustrates a cross-sectional view of the semiconductor device of FIG. 3A along a direction 3B-3B'.
FIG. 4 illustrates a cross-sectional view of a semiconductor device according to another embodiment of the invention.

Referring to FIGS. 3A and 3B, FIG. 3A illustrates a diagram view of a top view of a semiconductor device 300 according to an embodiment of the invention, and FIG. 3B illustrates a cross-sectional view of the semiconductor device 300 of FIG. 3A along a direction 3B-3B'.

The semiconductor device 300 is, for example, a FCBGA, such as a High Performance FCBGA; however, such exemplification is not meant to be for limiting.

As illustrated in FIGS. 3A and 3B, the semiconductor device 300 includes the substrate 110, the electronic component 120, a cover 330, a heat conduction component 340, a dam 350, the second adhesive layer 160 and at least one conductive portion 190.

As illustrated in FIG. 3B, the electronic component 120 is disposed on the substrate 110. The cover 130 is disposed on the substrate 110 and covers the electronic component 120. The heat conduction component 340 is disposed between the cover 330 and the electronic component 120. The dam 350 is disposed between the electronic component 120 and the cover 330 and surrounds the heat conduction component 340. As a result, it could prevent the heat conduction component 340 from overflowing outside the dam 350 during a reflow process for the conductive portion 190, and accordingly prevent the heat conduction component 340 from polluting the substrate 110 or other component, such as a passive component (not illustrated) disposed adjacent the electronic component 120.

In addition, the conductive portion 190 has a first melting point, and the dam 350 has a second melting point higher than the first melting point. As a result, in the reflow process for the conductive portion 190, the dam 350 stays solid state to block the overflow of the heat conduction component 340. In an embodiment, the conductive portion 190 is solder ball having the first melting point ranging, for example, 230° C. to 270° C., and the dam 350 has the second melting point ranging, for example, 280° C. to 300° C.

As illustrated in FIG. 3B, the cover 330 is made by a material, for example, metal, such as copper, aluminum, iron or a combination thereof. The cover 330 could conduct heat and increased strength of the semiconductor device 300 for reducing warpage of the semiconductor device 300.

As illustrated in FIG. 3B, the cover 330 includes the plate 131 and the second surrounding portion 134 which are shaped in the same process, such as stamp, pressing, etc. The plate 131 has the first surface 131$s$1 facing the substrate 110. The second surrounding portion 134 are disposed on the plate 131 and protrude with respect to (or relative to) the first surface 131$s$1. As viewed from −Z axis, the second surrounding portion 134 is a closed-ring for surrounding the whole of the electronic component 120 and the heat conduction component 340.

In an embodiment, the heat conduction component 340 is, for example, a TIM, such as a liquid TIM, a solid TIM or a paste TIM. The heat conduction component 340 includes material and/or structure similar to or the same as that of the liquid metal 140, and/or the heat conduction component 340 has property similar to or the same as that of the liquid metal 140.

In an embodiment, the dam 350 includes material and/or structure similar to or the same as that of the first adhesive layer 150, and/or the dam 350 has property similar to or the same as that of the first adhesive layer 150. In an embodiment, the dam 350 is, for example, the first adhesive layer 150.

As illustrated in FIG. 3B, the second adhesive layer 160 is disposed between the substrate 110 and the cover 330. For example, the second adhesive layer 160 is disposed between the terminal 134$b$ of the second surrounding portion 134 and the substrate 110 for fixing relative position between the cover 330 and the substrate 110. In an embodiment, viewed from top of the second adhesive layer 160, the second adhesive layer 160 has a ringed-shape, for example, a closed ringed-shape for closing the gap (if any) between the second surrounding portion 134 and the substrate 110. As a result, an external impurity is prevented from invading interior of the semiconductor device 300 through the second surrounding portion 134 and the substrate 110.

In an embodiment, the second adhesive layer 160 and the dam 350 could be formed of the same material.

As illustrated in FIG. 3B, the conductive portions 190 are formed on the lower surface 110$b$ of the substrate 110. Any one of the conductive portions 190 is, for example, bump, solder ball, etc. The semiconductor device 300 is bonded to and electrically connected with an external electronic device (for example, PCB, etc.) through the conductive portions 190 of the semiconductor device 300.

Referring to FIG. 4, FIG. 4 illustrates a cross-sectional view of a semiconductor device 400 according to another embodiment of the invention.

The semiconductor device 400 is, for example, a FCBGA, such as a High Performance FCBGA; however, such exemplification is not meant to be for limiting.

As illustrated in FIG. 4, the semiconductor device 400 includes the substrate 110, an electronic component 420, the cover 330, the heat conduction component 340, a third adhesive layer 455, a dam 450, the second adhesive layer 160 and at least one conductive portion 190.

As illustrated in FIG. 4, the electronic component 420 is disposed on the substrate 110. The cover 330 is disposed on the substrate 110 and covers the electronic component 420. The heat conduction component 340 is disposed between the cover 330 and the electronic component 420. The dam 450 is disposed between the electronic component 420 and the cover 330 and surrounds the heat conduction component 340. As a result, it could prevent the heat conduction component 340 from overflowing outside the dam 450 during a reflow process for the conductive portion 190, and accordingly prevent the heat conduction component 340 from polluting the substrate 110 or other component, such as a passive component (not illustrated) disposed adjacent the electronic component 420.

The semiconductor device 400 includes the features similar to or the same as that of the semiconductor device 300 expect that the electronic component 420 includes different structures.

Furthermore, as illustrated in FIG. 4, the dam 450 and the electronic component 120 are integrated into one piece. For example, the dam 450 and the electronic component 120 are manufactured in the same process. The electronic component 420 has a top surface 420$u$ and a recess 420$r$ recessed with respect to the top surface 420$u$ to form the dam 450 surrounding the recess 420$r$. The heat conduction component 340 is formed within the recess 420$r$. There is at least one circuit formed within the dam 450. Alternatively, there is no any circuit formed within the dam 450. The third adhesive layer 455 is disposed between the cover 330 and the dam 450 of the electronic component 420 for sealing the recess 420$r$. Viewed from top of the third adhesive layer 455, the third adhesive layer 455 has a ringed-shape, for example, a closed ringed-shape.

Referring to FIG. 5, FIG. 5 illustrates a cross-sectional view of a semiconductor device 500 according to another embodiment of the invention.

The semiconductor device 500 is, for example, a FCBGA, such as a High Performance FCBGA; however, such exemplification is not meant to be for limiting.

As illustrated in FIG. 5, the semiconductor device 500 includes the substrate 110, the electronic component 120, a cover 530, the heat conduction component 340, the third adhesive layer 455, a dam 550, the second adhesive layer 160 and at least one conductive portion 190.

As illustrated in FIG. 5, the electronic component 120 is disposed on the substrate 110. The cover 530 is disposed on the substrate 110 and covers the electronic component 120. The heat conduction component 340 is disposed between the cover 330 and the electronic component 120. The dam 550 is disposed between the electronic component 120 and the cover 530 and surrounds the heat conduction component 340. As a result, it could prevent the heat conduction component 340 from overflowing outside the dam 550 during a reflow process for the conductive portion 190, and accordingly prevent the heat conduction component 340 from polluting the substrate 110 or other component, such as a passive component (not illustrated) disposed adjacent the electronic component 120.

The semiconductor device 500 includes the features similar to or the same as that of the semiconductor device 400 expect that the cover 530 includes different structures.

Furthermore, as illustrated in FIG. 5, the dam 550 and cover 330 are integrated into one piece. For example, the cover 530 includes the plate 131, the second surrounding portion 134 and the dam 550 which are shaped in the same process, such as stamp, pressing, etc. The dam 550 protrudes with respect to the first surface 131s1 to form a recess 530r. The heat conduction component 340 is formed within the recess 530r. There is at least one circuit formed within the dam 550. Alternatively, there is no any circuit formed within the dam 550. The third adhesive layer 455 is disposed between the dam 550 of the cover 530 and the electronic component 120 for fixing relative position between the cover 530 and the electronic component 120. The third adhesive layer 455 could seal the recess 420r to prevent the heat conduction component 340 from overflowing outside the dam 550.

Figures 6A, 6B, 6C:
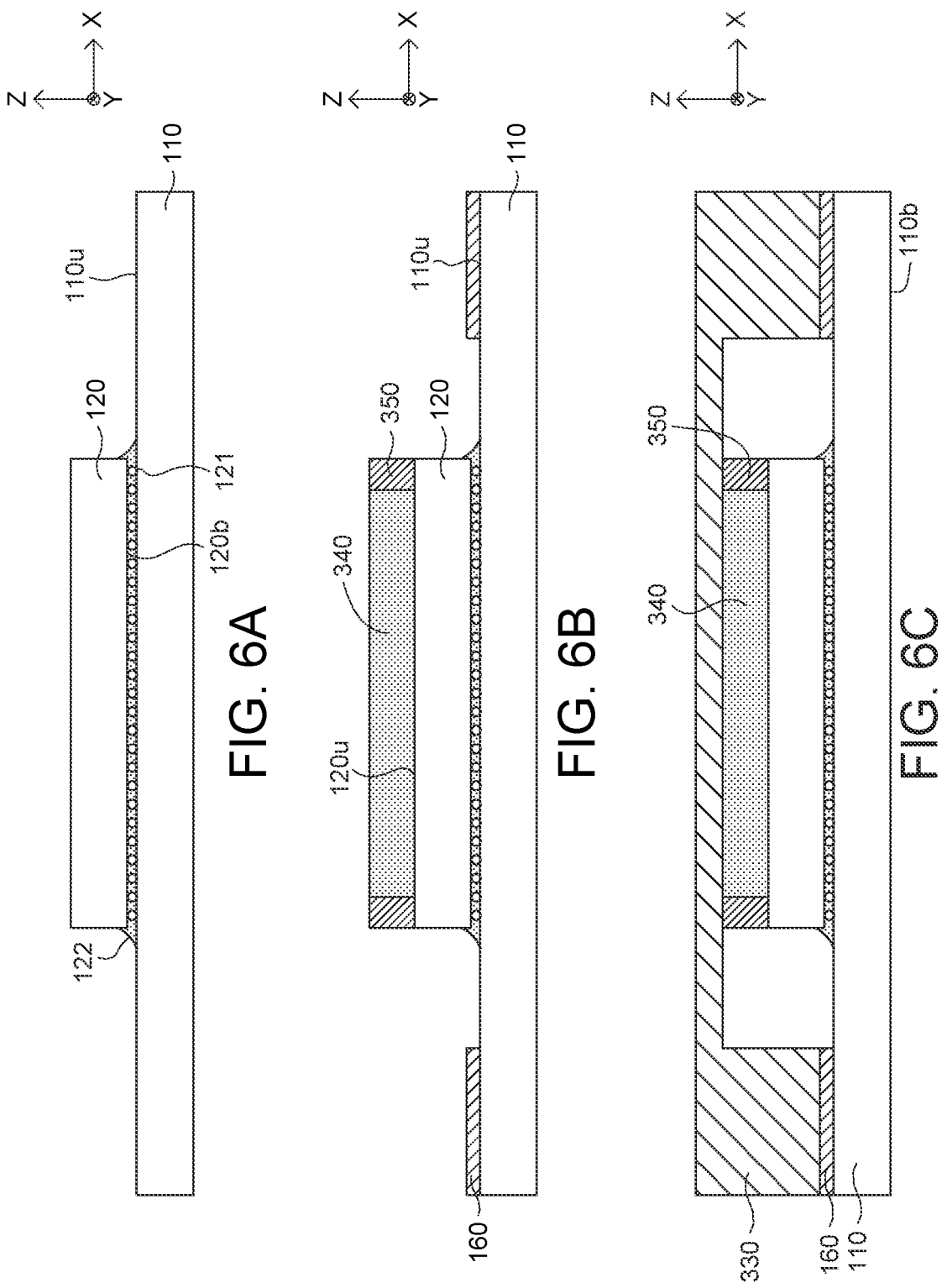
FIGS. 6A to 6C illustrate manufacturing processes of the semiconductor device of FIG. 3B.

Referring to FIGS. 6A to 6C, FIGS. 6A to 6C illustrate manufacturing processes of the semiconductor device 300 of FIG. 3B.

As illustrated in FIG. 6A, the electronic component 120 is disposed on the substrate 110, wherein the electronic component 120 includes at least one conductive portion 121, wherein the electronic component 120 is bonded to the substrate 110 through at least one conductive portion 121. In addition, the underfill 122 is formed between the lower surface 120b of the electronic component 120 and the upper surface 110u of the substrate 110 to encapsulate the conductive portions 121.

As illustrated in FIG. 6B, the dam 350 is formed on the upper surface 120u of the electronic component 120, wherein the dam 350 is formed on the peripheral zone of the upper surface 120u. Viewed from top of the dam 350, the dam 350 has a ringed-shape, for example, a closed ringed-shape.

As illustrated in FIG. 6B, the heat conduction component 340 is formed within a region surrounded by the dam 350.

As illustrated in FIG. 6B, the second adhesive layer 160 is formed on the upper surface 110u of the substrate 110, wherein the second adhesive layer 160 is formed on a peripheral zone of the upper surface 110u. Viewed from top of the second adhesive layer 160, the second adhesive layer 160 has a ringed-shape, for example, a closed ringed-shape.

In addition, the embodiment of the present invention does not limit the order of forming the dam 350, the heat conduction component 340 and the second adhesive layer 160.

As illustrated in FIG. 6C, the cover 330 is disposed on the substrate 110 to cover the electronic component 120, the heat conduction component 340 and the dam 350 through the second adhesive layer 160. The second adhesive layer 160 connects the cover 330 and the substrate 110 for fixing relative position between the cover 330 and the substrate 110. The cover 330 is disposed on the electronic component 120 through the dam 350. The dam 350 connects the cover 330 and the electronic component 120 for fixing relative position between the cover 330 and the electronic component 120.

Then, at least one conductive portion 190 is formed on the lower 110b of the substrate 110 by reflow process. Due to the dam 350 blocking the heat conduction component 340, it could prevent the heat conduction component 340 from overflowing outside the dam 350 during a reflow process for the conductive portion 190, and accordingly prevent the heat conduction component 340 from polluting the substrate 110 or other component, such as a passive component (not illustrated) disposed adjacent the electronic component 120.

In addition, the conductive portion 190 has the first melting point, and the dam 350 has the second melting point higher than the first melting point. As a result, in the reflow process for the conductive portion 190, the dam 350 stays solid state to block the overflow of the heat conduction component 340.

Referring to FIGS. 7A to 7C, FIGS. 7A to 7C illustrate manufacturing processes of the semiconductor device 400 of FIG. 4.

As illustrated in FIG. 7A, the electronic component 420 is disposed on the substrate 110, wherein the electronic component 420 includes at least one conductive portion 121, wherein the electronic component 420 is bonded to the substrate 110 through at least one conductive portion 121. In addition, the underfill 122 is formed between the lower surface 120b of the electronic component 420 and the upper surface 110u of the substrate 110 to encapsulate the conductive portions 121. In addition, the electronic component 420 has the top surface 420u and the recess 420r recessed with respect to the top surface 420u to form the dam 450 surrounding the recess 420r.

As illustrated in FIG. 7B, the third adhesive layer 455 is disposed on the dam 450 of the electronic component 420. In another embodiment, the third adhesive layer 455 could be disposed on the cover 330.

As illustrated in FIG. 7B, the heat conduction component 340 is formed within the recess 420r surrounded by the dam 350.

As illustrated in FIG. 7B, the second adhesive layer 160 is formed on the upper surface 110u of the substrate 110, wherein the second adhesive layer 160 is formed on a peripheral zone of the upper surface 110u. Viewed from top of the second adhesive layer 160, the second adhesive layer 160 has a ringed-shape, for example, a closed ringed-shape.

In addition, the embodiment of the present invention does not limit the order of forming the heat conduction component 340, the third adhesive layer 455 and the second adhesive layer 160.

As illustrated in FIG. 7C, the cover 330 is disposed on the substrate 110 to cover the electronic component 420, the heat conduction component 340 and the dam 450 through the second adhesive layer 160. The second adhesive layer 160 connects the cover 330 and the substrate 110 for fixing relative position between the cover 330 and the substrate 110. The cover 330 is disposed on the electronic component 420 through the third adhesive layer 455. The third adhesive layer 455 connects the cover 330 and the electronic component 420 for fixing relative position between the cover 330 and the electronic component 420. The third adhesive layer 455 could seal the recess 420r to prevent the heat conduction component 340 from overflowing outside the dam 450.

Then, at least one conductive portion 190 is formed on the lower 110b of the substrate 110 by reflow process. Due to the dam 450 blocking the heat conduction component 340, it could prevent the heat conduction component 340 from overflowing outside the dam 450 during reflow process for the conductive portion 190, and accordingly prevent the heat conduction component 340 from polluting the substrate 110 or other component, such as a passive component (not illustrated) disposed adjacent the electronic component 120.

In addition, the conductive portion 190 has the first melting point, and the dam 450 has the second melting point higher than the first melting point. As a result, in the reflow process for the conductive portion 190, the dam 450 stays solid state to block the overflow of the heat conduction component 340.

Figures 8A, 8B, 8C:
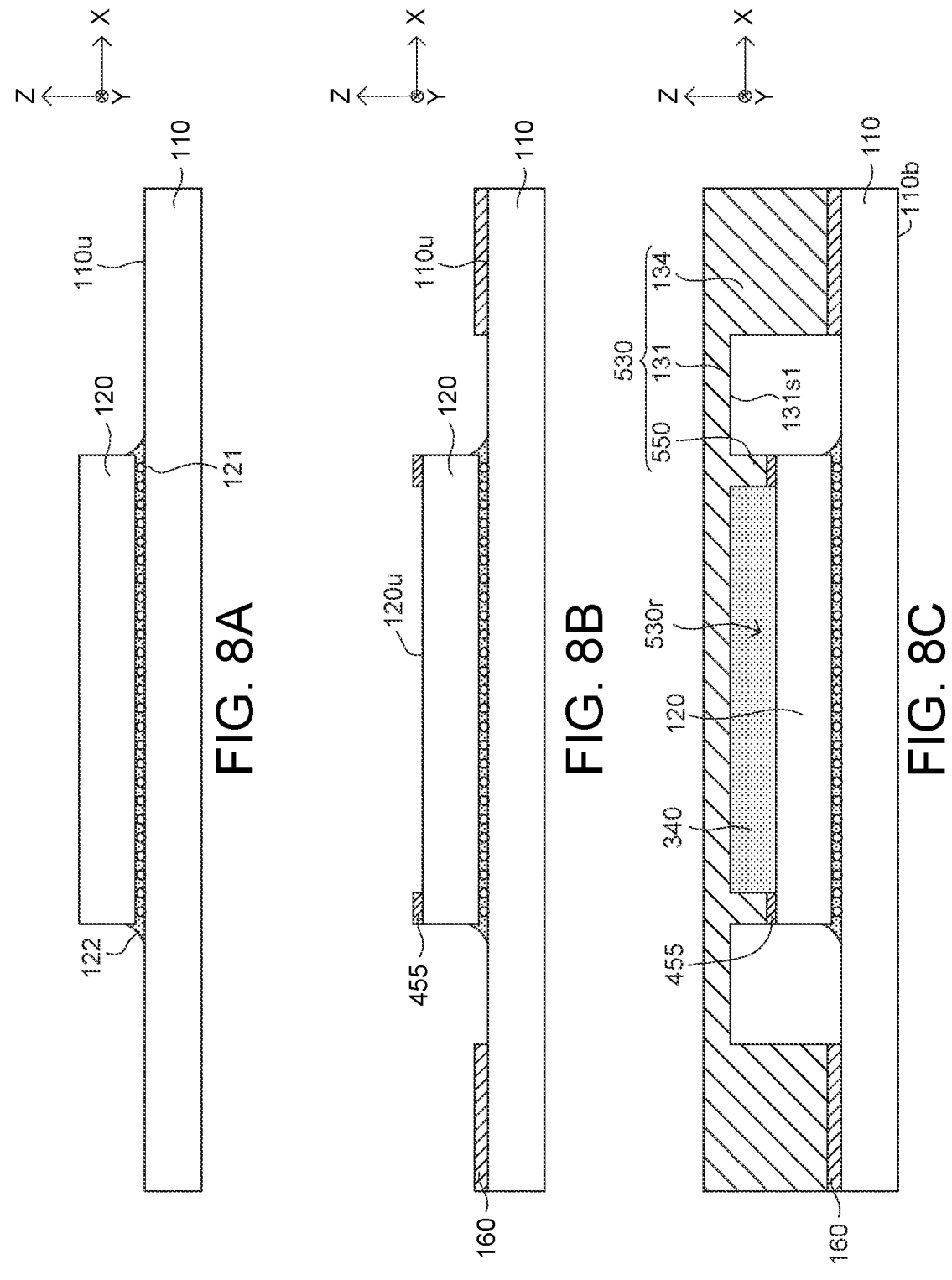
FIGS. 8A to 8C illustrate manufacturing processes of the semiconductor device of FIG. 5.

Referring to FIGS. 8A to 8C, FIGS. 8A to 8C illustrate manufacturing processes of the semiconductor device 500 of FIG. 5.

As illustrated in FIG. 8A, the electronic component 120 is disposed on the substrate 110, wherein the electronic component 120 includes at least one conductive portion 121, wherein the electronic component 120 is bonded to the substrate 110 through at least one conductive portion 121. In addition, the underfill 122 is formed between the lower surface 120b of the electronic component 120 and the upper surface 110u of the substrate 110 to encapsulate the conductive portions 121.

As illustrated in FIG. 8B, the third adhesive layer 455 is formed on the upper surface 120u of the electronic component 120, wherein the third adhesive layer 455 is formed on a peripheral zone of the upper surface 120u. Viewed from top of the third adhesive layer 455, the third adhesive layer 455 has a ringed-shape, for example, a closed ringed-shape. In another embodiment, the third adhesive layer 455 could be disposed on the cover 330. For example, the third adhesive layer 455 could be disposed on the dam 550 of the cover 530 in FIG. 8C.

As illustrated in FIG. 8B, the second adhesive layer 160 is formed on the upper surface 110u of the substrate 110, wherein the second adhesive layer 160 is formed on a peripheral zone of the upper surface 110u. Viewed from top of the second adhesive layer 160, the second adhesive layer 160 has a ringed-shape, for example, a closed ringed-shape.

As illustrated in FIG. 8C, the heat conduction component 340 is formed within the recess 530r surrounded by the dam 530. The cover 530 includes the plate 131, the second surrounding portion 134 and the dam 550. The dam 550 protrudes with respect to the first surface 131s1. In an embodiment, the heat conduction component 340 could be formed on the cover 530 in advance, or the heat conduction component 340 could be formed on the electronic component 120 in advance.

In addition, the embodiment of the present invention does not limit the order of forming the heat conduction component 340, the third adhesive layer 455 and the second adhesive layer 160.

As illustrated in FIG. 8C, the cover 530 is disposed on the substrate 110 to cover the electronic component 120 and the heat conduction component 340 through the second adhesive layer 160. The second adhesive layer 160 connects the cover 330 and the substrate 110 for fixing relative position between the cover 530 and the substrate 110. The cover 530 is disposed on the electronic component 120 through the third adhesive layer 455. The third adhesive layer 455 connects the cover 530 and the electronic component 120 for fixing relative position between the cover 530 and the electronic component 120. The third adhesive layer 455 could seal the recess 530r of the cover 530 to prevent the heat conduction component 340 from overflowing outside the dam 550.

Then, at least one conductive portion 190 is formed on the lower 110b of the substrate 110 by reflow process. Due to the dam 550 blocking the heat conduction component 340, it could prevent the heat conduction component 340 from overflowing outside the dam 550 during a reflow process for the conductive portion 190, and accordingly prevent the heat conduction component 340 from polluting the substrate 110 or other component, such as a passive component (not illustrated) disposed adjacent the electronic component 120.

In addition, the conductive portion 190 has the first melting point, and the dam 550 has the second melting point higher than the first melting point. As a result, in the reflow process for the conductive portion 190, the dam 550 stays solid state to block the overflow of the heat conduction component 340. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
   a substrate;
   an electronic component disposed on the substrate;
   a cover disposed on the substrate and covering the electronic component;
   a heat conduction component disposed between the electronic component and the cover; and
   a dam disposed between the electronic component and the cover and surrounding the heat conduction component;
   wherein the dam and one of the electronic component or the cover are integrated into one piece with the same material.

2. The semiconductor device as claimed in claim 1, wherein the heat conduction component is a solid thermal Interface Material (TIM).

3. The semiconductor device as claimed in claim 1, further comprising:
   a second adhesive layer disposed between the substrate and the cover.

4. The semiconductor device as claimed in claim 1, wherein the electronic component has a top surface and a recess recessed with respect to the top surface to form the dam.

5. The semiconductor device as claimed in claim 4, further comprises:
   a third adhesive layer disposed between the dam and the cover.

6. The semiconductor device as claimed in claim 1, wherein the cover comprises:
   the dam; and
   a plate having a first surface;

wherein the dam protrudes with respect to the first surface.

7. The semiconductor device as claimed in claim 6, further comprises:

a third adhesive layer disposed between the dam and the electronic component.

8. The semiconductor device as claimed in claim 1, further comprises:

a solder ball disposed under the substrate and having a first melting point;

wherein the dam has a second melting point higher than the first melting point.

\* \* \* \* \*